US006597935B2

(12) United States Patent
Prince et al.

(10) Patent No.: US 6,597,935 B2
(45) Date of Patent: Jul. 22, 2003

(54) METHOD FOR HARMONIC PHASE MAGNETIC RESONANCE IMAGING

(75) Inventors: Jerry L. Prince, Lutherville, MD (US); Nael F. Osman, Baltimore, MD (US)

(73) Assignee: The Johns Hopkins University, Baltimore, MD (US)

( * ) Notice: Subject to any disclaimer, the term of this patent is extended or adjusted under 35 U.S.C. 154(b) by 186 days.

(21) Appl. No.: 09/777,585

(22) Filed: Feb. 6, 2001

(65) Prior Publication Data

US 2001/0031037 A1 Oct. 18, 2001

Related U.S. Application Data

(60) Provisional application No. 60/181,527, filed on Feb. 10, 2000.

(51) Int. Cl.$^7$ ................................................. A61B 3/16
(52) U.S. Cl. ..................................... 600/410; 324/309
(58) Field of Search ............................... 600/410, 413, 600/420; 324/307, 309; 128/920, 922

(56) References Cited

U.S. PATENT DOCUMENTS

| | | | |
|---|---|---|---|
| 4,486,708 A | 12/1984 | Macovski | 324/309 |
| 5,054,489 A | 10/1991 | Axel et al. | 600/419 |
| 5,111,820 A | 5/1992 | Axel et al. | 600/413 |
| 5,217,016 A | 6/1993 | Axel et al. | 600/410 |
| 5,275,163 A | 1/1994 | McKinnon et al. | 600/410 |
| 5,281,914 A | 1/1994 | Conturo et al. | 324/309 |
| 5,315,248 A | 5/1994 | Yamaguchi | 600/419 |
| 5,352,979 A | 10/1994 | Conturo | 324/307 |
| 5,363,044 A | 11/1994 | Xiang et al. | 324/309 |
| 5,379,766 A | 1/1995 | McKinnon et al. | 600/413 |
| 5,512,825 A | 4/1996 | Atalar et al. | 324/309 |
| 5,545,993 A * | 8/1996 | Taguchi et al. | 324/309 |
| 5,910,728 A | 6/1999 | Sodickson | 324/309 |
| 6,081,119 A | 6/2000 | Carson et al. | 324/307 |

| | | | |
|---|---|---|---|
| 6,453,187 B1 * | 9/2002 | Prince et al. | 600/410 |

FOREIGN PATENT DOCUMENTS

| | | |
|---|---|---|
| WO | WO 00/64344 | 11/2000 |

OTHER PUBLICATIONS

Aletras et al., 140 J. Magn. Reson. 41–57 (1999).
Amartur et al., 29(1) Magn. Reson. Med. 59–67 (1993).
Atalar et al., 32(6) Magn. Reson. Med. 773–77 (1994).
Axel et al., 171 Radiol. 841–45 (1989).
Axel et al., 172 Radiol. 349–50 (1989).
Denney Jr. et al., 14(4) IEEE Trans. Med. Imag. 625–35 (1995).
Fischer et al., 30 Magn. Reson. Med. 191–200 (1993).

(List continued on next page.)

Primary Examiner—Teresa Walberg
Assistant Examiner—Quang Van
(74) Attorney, Agent, or Firm—McKenna Long & Aldridge LLP

(57) ABSTRACT

The present invention provides methods for real-time measurement of motion of an object such as a portion of a patient in real-time through the use of harmonic phase (HARP) magnetic resonance imaging. This is accomplished by employing certain tagging protocols and imaging protocols. The imaging may be accomplished in two-dimension or three-dimension. In one embodiment, first and second tag pulse sequences are employed to provide two-dimensional pulse strain images. In another embodiment, a first tag pulse sequence is employed to determine a first harmonic phase image and a second tag pulse sequence is employed to determine a second harmonic phase image which is combined with the first image to create tagged images of circumferential and radial strains with third and fourth tag pulse sequences being employed to create images which are combined to establish longitudinal strain and thereby provide a three-dimensional strain image.

62 Claims, 14 Drawing Sheets

Acquisition of 1-0, 3-1 SPAMM spectral peaks for (a) horizontal tags and (b) vertical tags.

OTHER PUBLICATIONS

Fischer et al., 31 Magn. Reson. Med. 401–13 (1994).

Gupta et al., *On Variable Brightness Optical Flow for Tagged MRI*, JHU Tech. Rept. ECE 95–13. Info. Proc. Med. Imag., 323–34 (1995) Kluwer Academic Publishers, Netherlands.

Gupta et al., *Bandpass Optical Flow for Tagged MR Imaging*, Proceedings of International Conference on Image Processing, Oct. 26–29, 1997, Santa Barbara, CA USA.

McVeigh et al., 39 Magn. Reson. Imag. 657–61 (1998).

McVeigh et al., 180 Radiol. 677–83 (1991).

Moore et al., 2 J. Magn. Reson. Imag. 165–75 (1992).

Pelc et al., *Optimized Encoding for Phase Contrast Flow Measurement*, Society of Magnetic Resonance in Medicine, Ninth Annual Scientific Meeting and Exhibition, Aug. 18–24, 1990 NY, NY, USA.

Sodickson et al., Proc. Int'l Soc. Magn. Reson. Med. 387 (1999).

Wedeen, 27 Magn. Reson. Med. 52–67 (1992).

Weiger et al., Proc. Int'l Soc. Magn. Reson. Med. 385 (1999).

Young et al., 185 Radiol. 241–47 (1992).

Zerhouni et al, 169 Radiology 59–63 (1988).

* cited by examiner

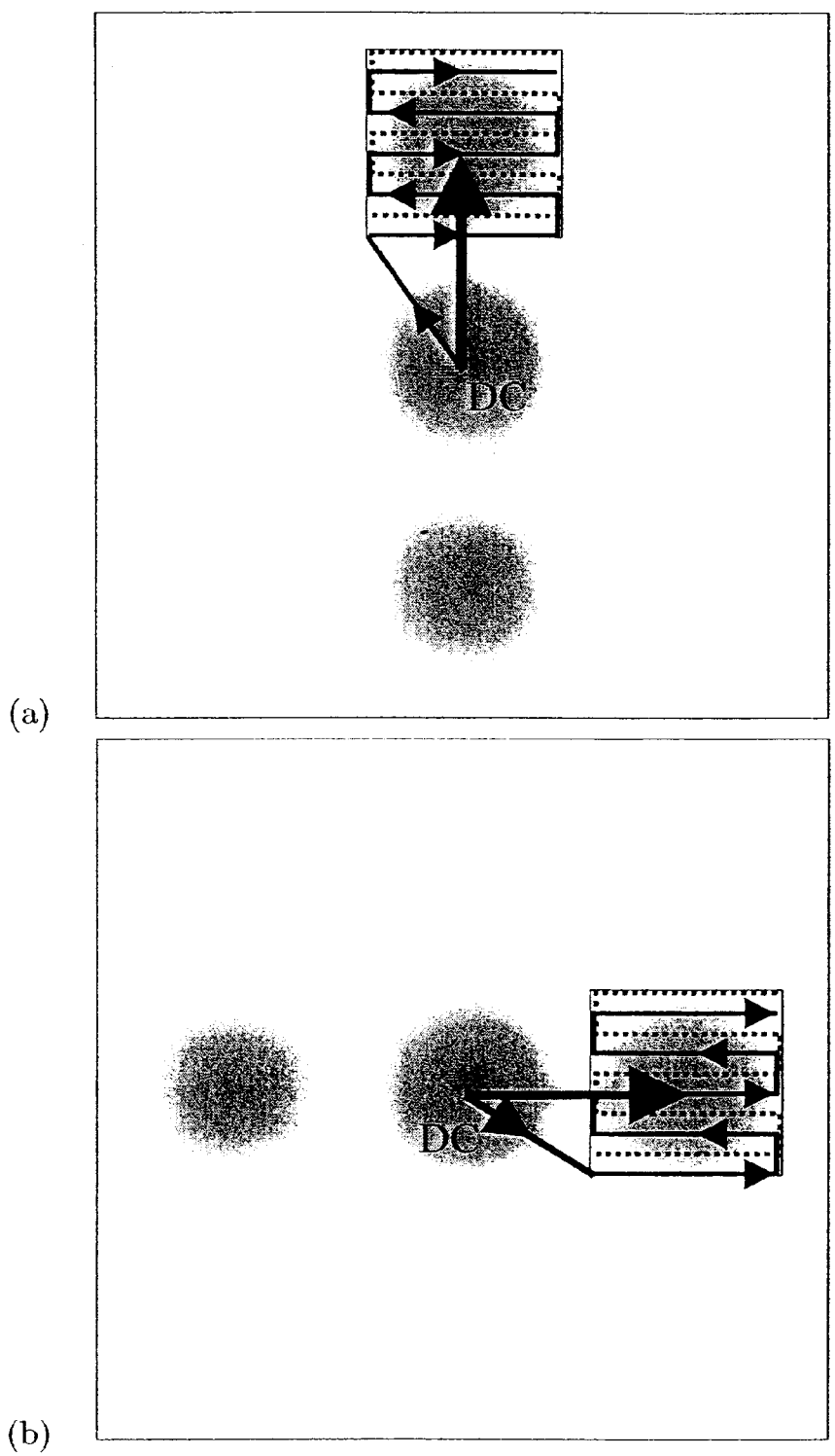
Figure 1: Acquisition of 1-D, 1-1 SPAMM spectral peaks for (a) horizontal tags and (b) vertical tags.

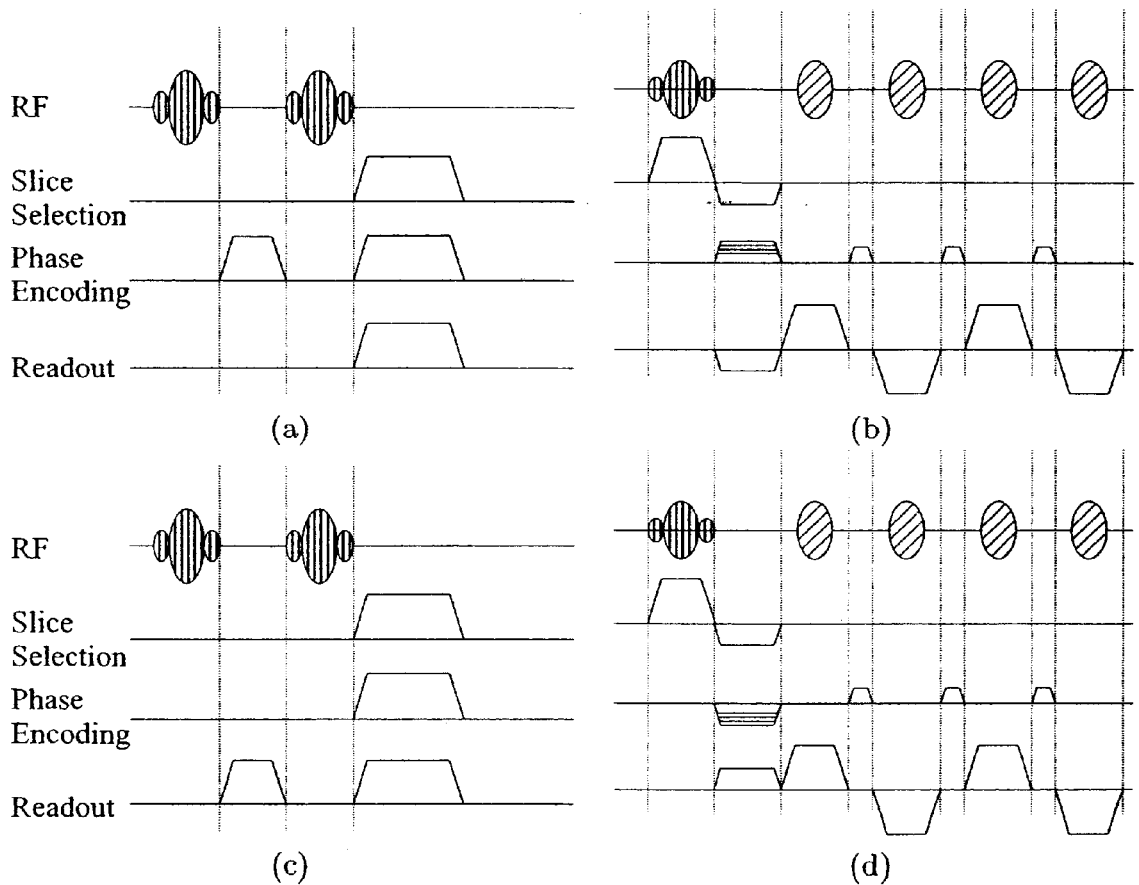
Figure 2: Pulse sequences for: (a) generating the horizontal tags; (b) imaging the harmonic peak generated from (a); (c) generating the vertical tags; and (d) imaging the harmonic peak generated from (c).

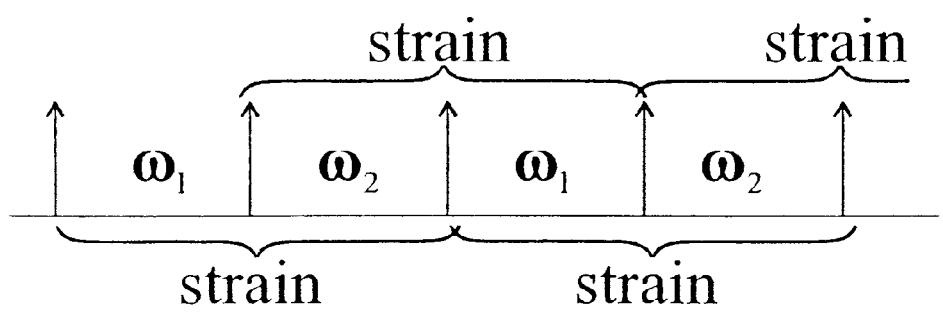
Figure 3: Successive calculation of strain with alternating tag orientations.

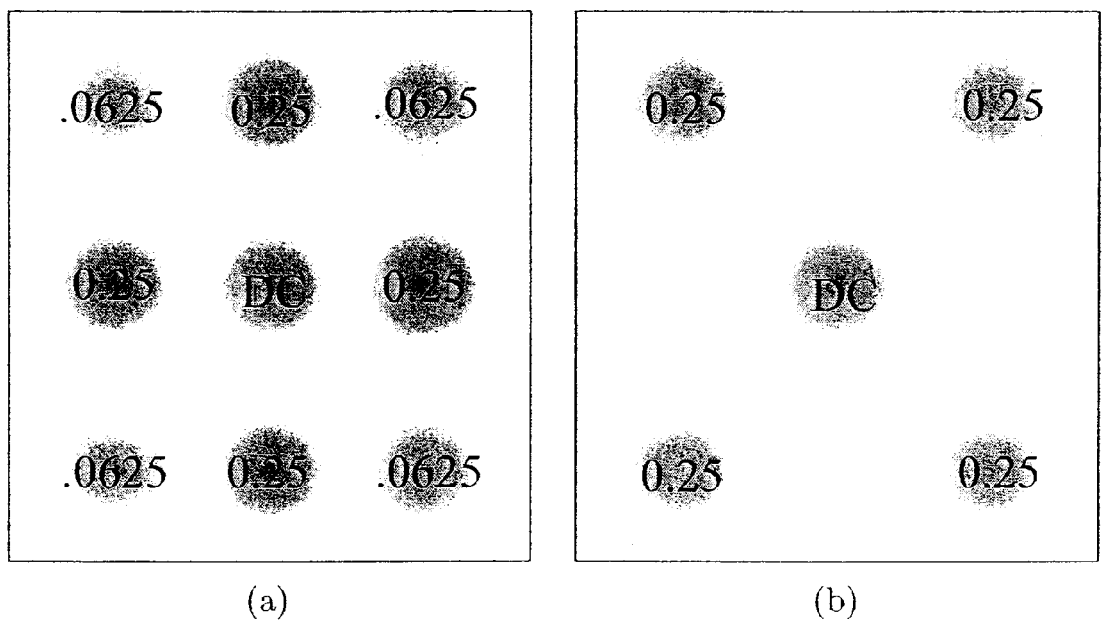
Figure 4: The distribution of spectral peaks in 2-D, 1-1 SPAMM with (a) 45-degree RF tagging pulses and (b) 90-degree RF tagging pulses.

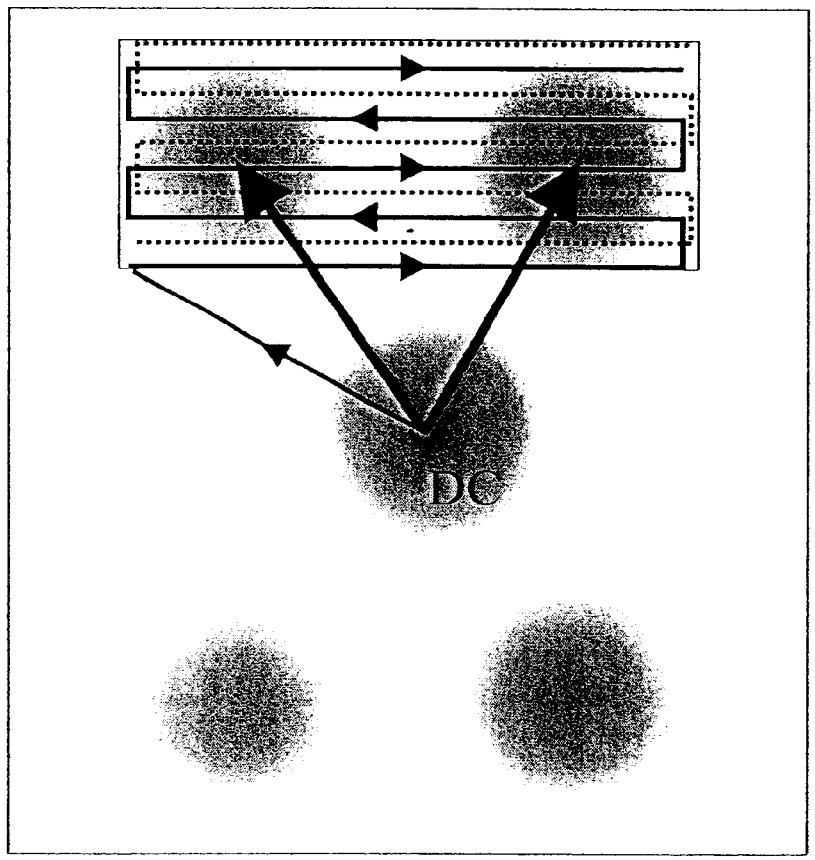
Figure 5: Simultaneous acquisition of two (2) linearly independent spectral peaks using multi-shot EPI.

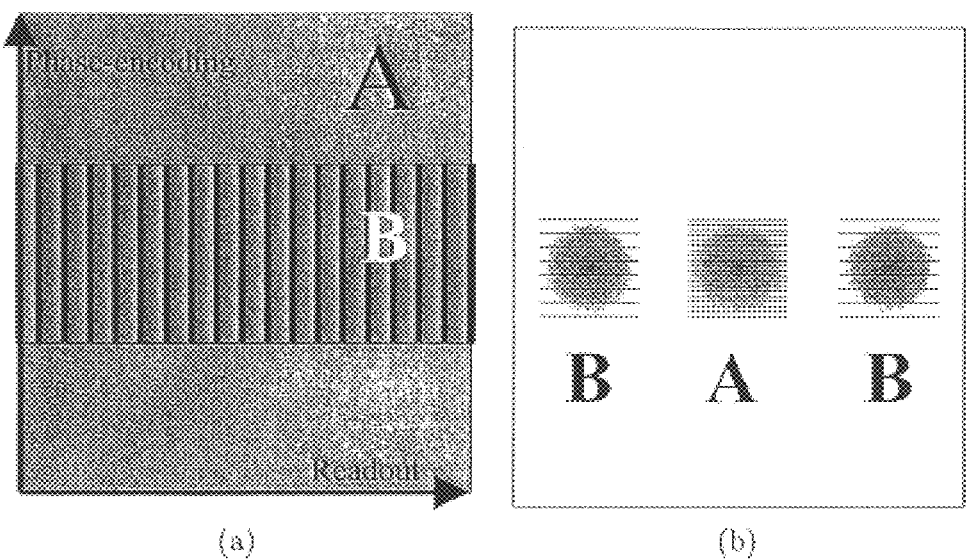
Figure 6: (a) Spatial domain depicting background (A) and tagged slab (B). (b) Fourier domain depicting DC spectral peak requiring dense sampling (A) and higher frequence spectral peaks requiring lower sampling density (B).

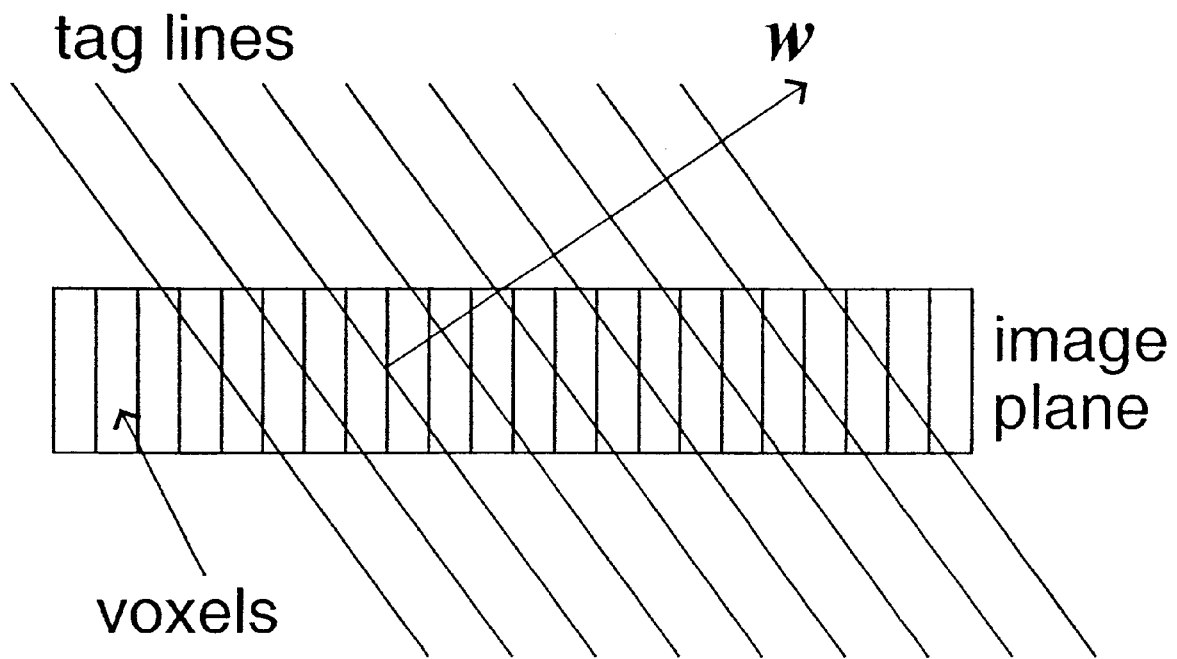
Figure 7: Out-of-plane tag attenuation.

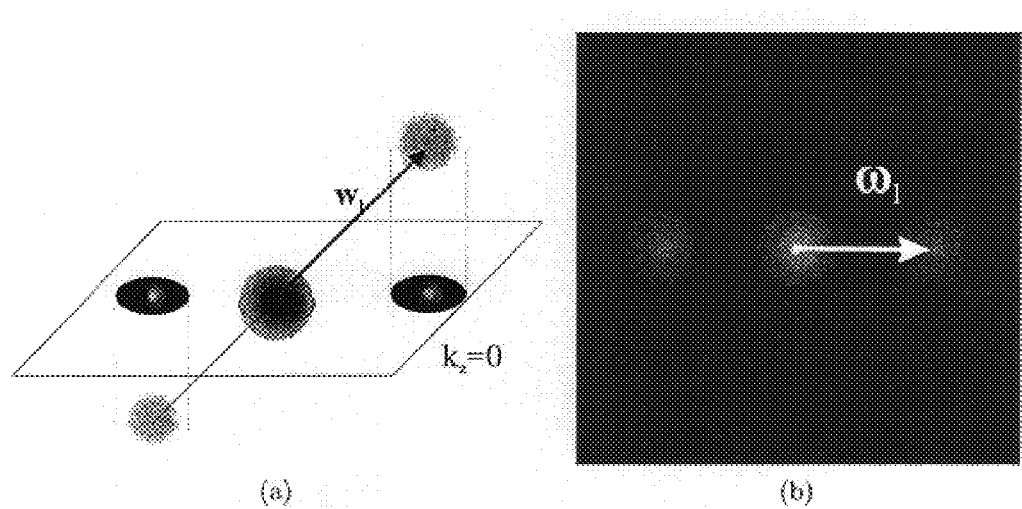
Figure 8: (a) A Fourier domain representation of an out-of-plane, 1-D, 1-1 SPAMM tag pattern. (b) Attenuation of the harmonic spectral peaks due to attenuation of the out-of-plane tags.

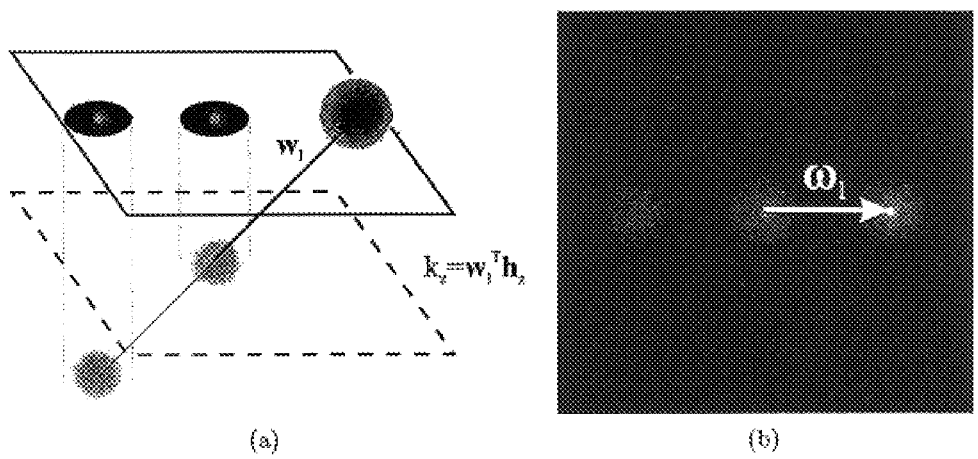
Figure 9: (a) A Fourier domain representation of an out-of-plane, 1-D, 1-1 SPAMM tag pattern. The dotted plane represents the $k_z = 0$ plane while the solid plane has a constant $z$ phase encode equal to $k_z = w_1^T h_z$. (b) 2-D $k$-space shows that both the opposite harmonic peak and the DC peak are attenuated by this scheme.

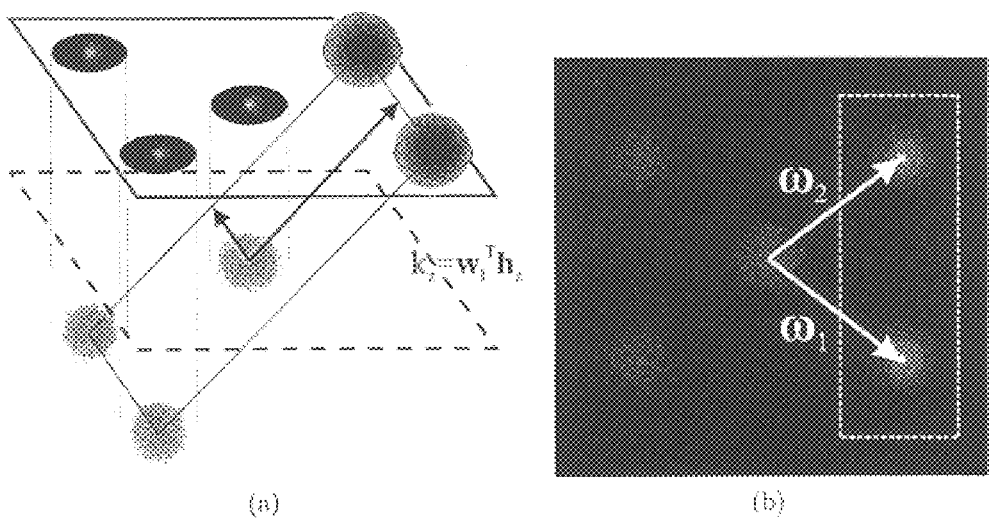
Figure 10: The distribution of spectral peaks in 3-D k-space given a 90-degree RF, 2-D, 1-1 SPAMM tagging sequence with one tag gradient pointing out of the image plane.

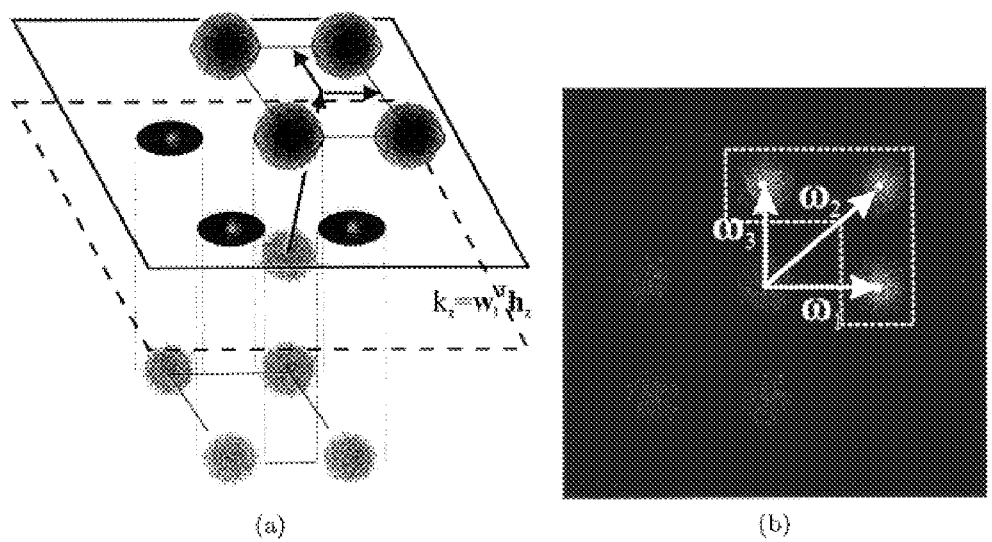
Figure 11: The distribution of spectral peaks in $k$-space after a 90-degree RF, 3-D, 1-1 SPAMM tagging sequence with one out-of-plane tag gradient.

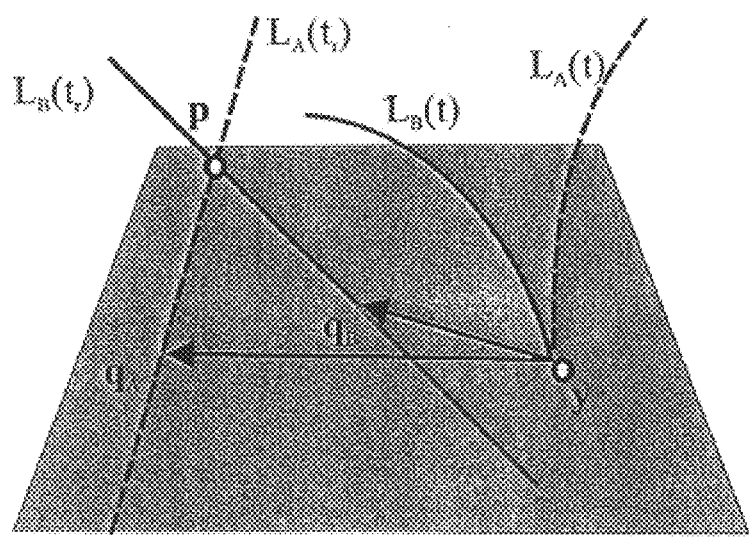
Figure 12: 3-D CHARP tracks image point y back to its material reference point p, which may be out of the image plane.

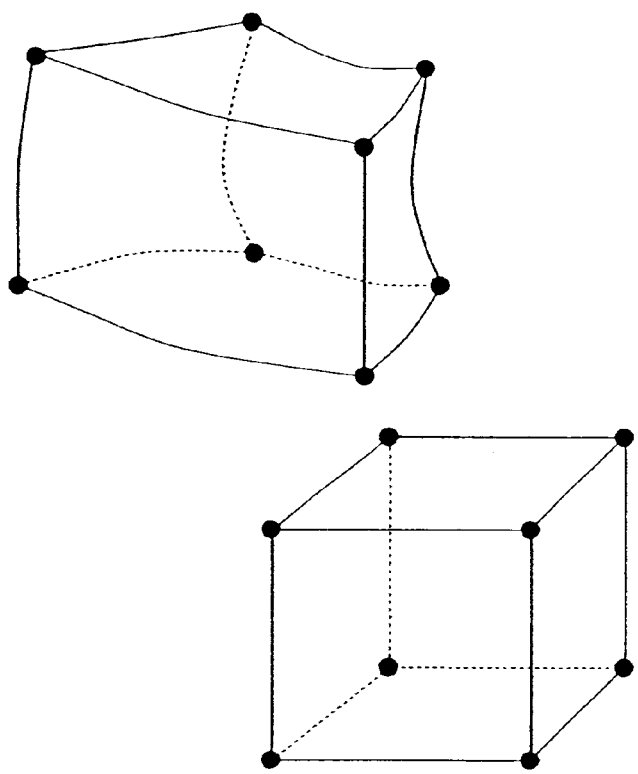
Figure 13: 3-D CHARP can track each point in a spatial quadrilateral (bottom right) to its material reference shape (upper left).

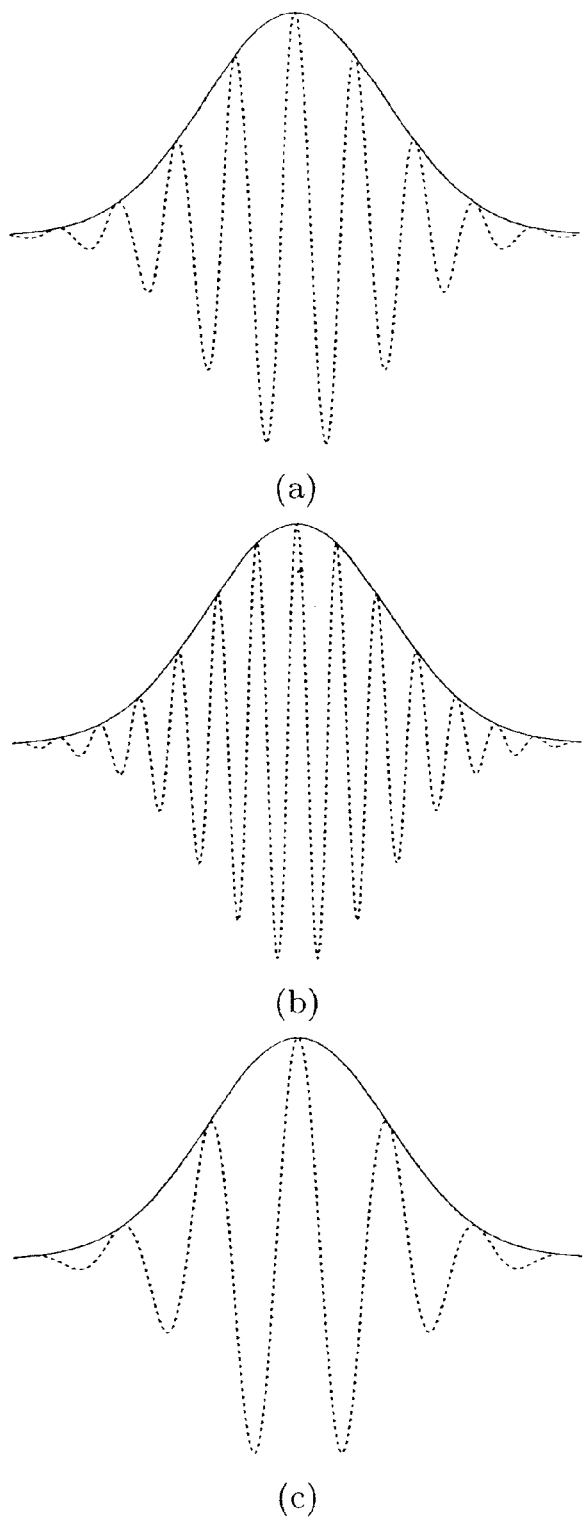
Figure 14: (a) A through-plane tag profile given an out-of-plane tag. Its frequency shifts (b) up with tissue compression and (c) down with tissue stretching.

METHOD FOR HARMONIC PHASE MAGNETIC RESONANCE IMAGING

CROSS REFERENCE TO RELATED APPLICATION

This Application claims the benefit of U.S. Provisional Application Ser. No. 60/181,527, filed Feb. 10, 2000, which is entitled "Method for Harmonic Phase Magnetic Resonance Imaging,"

GOVERNMENT SUPPORT

This invention was made with United States Government support under Grant No. HL47405-06 awarded by the National Institutes of Health and Grant No. MIP-9350336 awarded by the National Science Foundation. The Government has certain rights in this invention.

BACKGROUND OF THE INVENTION

1. Field of the Invention

The present invention relates to measurement of heart motion and fast dynamic processes in the body employing harmonic phase (HARP) magnetic resonance imaging and, more specifically, permits such imaging in both two dimensions and three dimensions including measurement of Eulerian strain and Lagrangian strain.

2. Description of the Prior Art

Numerous technologies have been known for use in magnetic resonance imaging. Included in these are magnetic resonance tagging, phase contrast, magnetic resonance imaging and echo-planar magnetic resonance imaging.

In connection with magnetic resonance tagging, the generation and use of SPAMM tag patterns has been known. (See Axel et al., Heart wall motion: improved method of spatial modulation of magnetization for MR imaging, *Radiology*, 172:349–350, 1989). SPAMM techniques involve generation of an amplitude modulation of underlying anatomy that gives rise to harmonic peaks.

It has also been known to use complimentary SPAMM (CSPAMM) as a tagging method. (See, generally, Fischer et al., Improved myocardial tagging contrast, *Mag. Res. Med.*, 30:191–200, 1993.)

It has also been known to attempt to rapidly acquire images of tagged patterns in motion as by the breath-hold imaging method. (See, Atalar et al., Minimization of dead-periods in MRI pulse sequences for imaging oblique planes, *Mag. Res. in Medicine*, 32(6):773–777, December 1994.) This prior art approach discloses a gradient-echo, multi-shot EPI (echo planar imaging) acquisition of a sequence of tagged images in a single slice within a breath-hold.

It has also been known to employ phase contrast (PC) magnetic resonance imaging as a means to directly measure motion by measuring a property sensitive to velocity. (See, generally, Pelc et al., Optimized encoding for phase contrast flow measurement, In Proc. Soc. Mag. Res. in Medicine, page 475, Soc., *Mag., Res. Medicine,* 1990, Annual Meeting, abstract only, and Wedeen, Magnetic resonance imaging of myocardial kinematics technique to detect, localize, and quantify the strain rates of the active human myocardium, Mag. Res. Med., 27:52–67, 1992.) Sequences of velocity fields or strain rates can be reconstructed and by integration the tracking of material points through the sequence and monitoring of the evolution of strain rate can occur. A significant distinction between tagging methods and PC methods is that PC encodes displacement in the transverse magnetization while tagging encodes it in the longitudinal magnetization. As a result, PC can generally image only small motions. PC also tends to yield very noisy images which have a low signal to noise ratio and is not suitable for fast imaging.

It has also been known to employ DENSE as disclosed in the PC literature. (See, generally, Aletras et al., High resolution strain analysis of the human heart with fast-DENSE, *J. Magn. Res.*, 140:41–57, 1999.) It is described as a stimulated echo technique, but also can be interpreted as a tagging technique.

It has been known to use multi-shot EPI acquisition of tagged images. (See, generally, Atalar et al., Minimization of dead-periods in MRI pulse sequences for imaging oblique planes, *Mag. Res. in Med.*, 32(6):773–777, 1994.)

Limiting the field-of-view in order to speed up magnetic resonance image acquisition has been suggested in two new technologies, i.e., SMASH (see, generally, Sodickson, et al., SMASH real-time cardiac MR imaging at echocardiographic frame rates, In Proc. of the Seventh Meeting of the International Society for Magnetic Resonance in Medicine, Philadelphia, Pa., May 1999, abstract 387) and SENSE (see, generally, Weiger et al., High performance cardiac real-time imaging using SENSE, In Proc. of the Seventh Meeting of the International Society for Magnetic Resonance in Medicine, Philadelphia, Pa., May 1999, abstract 385). Neither of these methods has been directly applied to tagged images.

Major developments over the past decade in tagged cardiac magnetic resonance (MR) imaging have made it possible to measure the detailed strain patterns of the myocardium in the in vivo heart. MR tagging uses a special pulse sequence to spatially modulate the longitudinal magnetization of the subject to create temporary features called tags, in the myocardium.

Fast spoiled gradient echo imaging techniques may be employed to create CINE sequences that show the motion of both the anatomy of the heart and the tag features that move with the heart. Analysis of the motion of the tag features in many images taken from different orientations and at different times can be used to track material points in three dimensions, leading to detailed maps of the strain patterns within the myocardium.

Tagged MRI has figured prominently in a many recent medical research and scientific investigations. It has been used to develop and refine models of normal and abnormal myocardial motion, to better understand the correlation of coronary artery disease with myocardial motion abnormalities, to analyze cardiac activation patterns using pacemakers, to understand the effects of treatment after myocardial infarction, and in combination with stress testing for the early detection of myocardial ischemia.

Fast, automated, and accurate analysis of tagged images using the harmonic phase (HARP) process has recently been described. Single-shot HARP (SHARP) has been described to process tagged images in the computation of Eulerian strain. Cine HARP (CHARP) has been described to track motion in image sequences and to enable the calculation of Lagrangian strain. Both methods have utility in the diagnosis of myocardial health.

In spite of the foregoing prior art systems, there remains a need for an improved system for accurate, rapid imaging of heart motion and other dynamic process in the body.

PCT Application Ser. No. PCT/US00/10232, filed Apr. 14, 2000 (based upon Provisional Application No. 60/130, 595, filed Apr. 22, 1999) disclosed cardiac motion tracking employing harmonic phase images acquired using magnetic resonance imaging in order to track material points and calculate Lagrangian strain in the heart. Prior U.S. patent application Ser. No. 09/131,589, filed Oct. 10, 1998 disclosed methods of employing tagged magnetic resonance imaging and associated "angle images" for determining two-dimensional or three-dimensional strain, small displacements, creating synthetic tag lines and optical flow processing.

SUMMARY OF THE INVENTION

The above-described need has been met by the present invention.

This invention aids in the measurement of both heart motion and fast dynamic processes in the body using magnetic resonance (MR) imaging. The harmonic phase (HARP) process is a method of rapidly processing tagged MR images to compute tag lines, optical flow, path lines, and both Eulerian and Lagrangian strain within the heart muscle. This invention extends and improves the capabilities of the HARP methodology through MR scanner modifications that will enable real-time imaging of strain within a cross-section of the heart, full three-dimensional imaging of strain in a single breath-hold, and real-time imaging of dynamical processes within the body using HARP's bandpass filtering methodology. Real-time imaging of myocardial strain enables diagnosis without breath-holds and permits immediate feedback about cardiac status such as, during stress testing, for example. This will allow patients that are more critically ill to be tested safely.

The present invention employs special modifications to the MR scanner image acquisition protocol to improve and extend the capabilities of HARP and create an entirely new way to image dynamic processes within the human body. The new capabilities include (1) real-time strain imaging with no breath-holds, (2) near real-time imaging of three-dimensional strain within an image plane, (3) three-dimensional imaging of strain over the myocardial volume within a single breath-hold, and (4) real-time imaging of arbitrary dynamic processes within the body using the HARP methodology.

These new capabilities provide several new avenues of clinical care. With imaging of strain with no breath-holds, patients that are incapable of breath-holding will be able to undergo cardiac strain analysis in the MR scanner, as well as other imaging. This was previously not known. Real-time strain imaging with the MR scanner will make it safer to administer pharmaceuticals that create artificial cardiac stress. Full 3-D (three-dimensional) strain analysis within a breath-hold will make a full assessment of myocardial motion abnormalities possible within a stress test protocol. Also, this approach to the real-time imaging of dynamic processes using HARP is different from other existing approaches and should provide faster temporal resolution with fewer artifacts.

All of these techniques taken together make it possible for the MR tagging motion estimation methodology to be practiced in other organ systems and parts of the human body besides the heart.

It is an object of the present invention to provide a method of rapidly measuring heart motion and other fast dynamic processes in the body employing harmonic phase (HARP) methods in an accurate and efficient manner.

It is a further object of the present invention to provide such methods which may be employed with improved tagged magnetic resonance imaging techniques.

It is a further object of the present invention to provide such methods which are usable in both two-dimensional and three-dimensional measurement.

It is another object of the present invention to provide real-time imaging of the heart and other parts of the body.

It is another object of the present invention to select tagging protocols which minimize undesired interference from DC spectral peaks.

It is a further object of the present invention to provide improved means for automatically imaging three-dimensional strain in the heart and other body tissues.

It is a further object of the present invention to provide efficient means of imaging strain with either a single breath-hold or no breath-holds.

These and other objects of the invention will be more fully understood from the following description of the invention with reference to the drawings appended hereto.

BRIEF DESCRIPTION OF THE DRAWINGS

FIGS. 1(a) and 1(b) illustrate spectral peaks respectively for horizontal tags and vertical tags employing tagging processes of the present invention.

FIG. 2 illustrates pulse sequences with

FIG. 2(a) illustrating the pulse sequences for generating horizontal tags and

FIG. 2(b) illustrating the imaging of the horizontal peak generated from the horizontal tags of FIG. 2(a).

FIG. 2(c) illustrates the pulse sequence for generating the vertical tags and

FIG. 2(d) illustrates the imaging of the harmonic peak generated from the pulse sequence of FIG. 2(c).

FIG. 3 is an illustration of successive calculation of strain with alternating tag orientations.

FIG. 4(a) illustrates the distribution of spectral peaks employing a particular tag pattern with 45-degree RF tagging pulses and FIG. 4(b) illustrates the distribution of spectral peaks with a particular pulse sequence and 90-degree RF tagging pulses.

FIG. 5 illustrates the simultaneous acquisition of two linearly independent spectral peaks employing a particular imaging protocol.

FIG. 6(a) illustrates a spatial domain showing background A and tagged slab B.

FIG. 6(b) illustrates the Fourier domain depicting a DC spectral peak requiring dense sampling A and high frequency spectral peaks requiring lower sampling density B.

FIG. 7 illustrates out-of-plane tag attenuation.

FIG. 8(a) illustrates a Fourier domain representation of an out-of-plane tag pattern and FIG. 8(b) illustrates attenuation of the harmonic spectral peaks due to attenuation of the out-of-plane tags.

FIG. 9(a) illustrates a Fourier domain representation of an out-of-plane tag pattern and FIG. 9(b) illustrates two-dimensional Fourier space showing both the opposite harmonic peak and the DC peak which are attenuated.

FIG. 10(a) shows the distribution of spectral peaks in three-dimensional Fourier space with a 90-degree RF tagging sequence with one tag gradient pointing out of the image plane and FIG. 10(b) shows the attenuation.

FIG. 11(a) shows the distribution of spectral peaks in Fourier space (k-space) after a 90-degree RF tagging sequence with one out-of-plane tag gradient and FIG. 11(b) shows the corresponding attenuation.

FIG. 12 shows a three-dimensional tracking image point of image point y back to its material reference point p which need not be in the image plane.

FIG. 13 discloses a three-dimensional protocol which contract each point in a spatial quadrilateral configuration as shown in the lower figure to its material reference shape shown in the upper figure.

FIG. 14(a) shows a through-plane tag profile given an out-of-plane tag.

FIG. 14(b) shows the frequency shifting up with tissue compression and

FIG. 14(c) shows the frequency shifting down with tissue stretching.

DESCRIPTION OF THE PREFERRED EMBODIMENTS

As employed herein, the term "patient" means a member of the animal kingdom including human beings.

As employed herein, the term "object" shall mean a portion of a patient which is the subject of dynamic motion with respect to other portions of the body or with respect to the surroundings of the body and shall expressly include, but not be limited to the heart and portions thereof, muscles, tongue, cerebrospinal fluid, and the brain.

HARP motion estimation methods use Fourier space (k-space) data localized around spectral peaks created by the MR tagging process. To date, HARP processing has been applied to conventional tagged MR image data that was not specifically acquired for HARP processing. This invention describes modifications to the MR scanning protocol that enables ultrafast and accurate imaging of spectral peaks for (1) real-time imaging of strain in image planes, (2) volumetric strain imaging in a breath-hold, and (3) real-time imaging of dynamic processes. These methods require modifications to the MR scanning protocol, and can be accomplished by reprogramming the scanner's data acquisition protocol through pulse sequence programming without requiring hardware modification.

HARP processing involves the acquisition of isolated spectral peaks created by the MR tagging process. The present invention involves the fast, accurate acquisition of isolated spectral peaks. This process involves both modifications to the MR tagging process and the MR image acquisition process.

To reduce interference from higher-order spectral peaks in the acquisition of 2-D (two-dimensional) spectral peaks, a 1—1 SPAMM as is employed as the basic tagging protocol. It has only three spectral peaks in its 1-D tag pattern, as shown in the k-space diagrams of FIG. 1. Tissue motion between the time of tagging and the time of imaging causes some spreading of the spectral peaks but most of the motion information is still concentrated around the (non-DC) spectral peaks even after motion. Multi-shot, echo-planar MR imaging is used as shown in FIG. 1 to rapidly scan k-space around the spectral peaks. The dotted lines indicate the possibility of interleaving the acquisitions for imaging a larger field-of-view. The use of spiral scanning to acquire each spectral peak is another means for effecting rapid scanning of k-space.

Pulse sequence diagrams for implementing this protocol are shown in FIG. 2. FIG. 2(a) shows the pulse sequence to generate horizontal tags, and FIG. 2(b) shows the pulse sequence to image the generated harmonic peak, as depicted in FIG. 1(a). FIG. 2(c) shows the pulse sequence to generate vertical tags, and FIG. 2(d) shows the pulse sequence to image the generated harmonic peak, as depicted in FIG. 1(b).

In this embodiment, horizontal tags are applied and imaged and then vertical tags are applied and imaged. This alternating tag orientation process is continually repeated so that two-dimensional HARP strain can be calculated in succession using overlapping tag acquisitions, as shown in FIG. 3. In cardiac imaging, a different tag orientation would be applied each heartbeat, permitting calculation of strain (over a CINE sequence within the cardiac cycle if desired) every heartbeat but delayed by one heartbeat. In imaging other tissues within the body, either repeating motion can be imaged (like the heart) or slowly changing systems can be imaged this way.

HARP strain computations involve acquisition of linearly independent spectral peaks. To acquire this information faster, it is possible to acquire two linearly independent spectral peaks simultaneously. To do this, 2-D, 1—1 SPAMM tagging can be used to produce nine spectral peaks in 2-D tagging, as depicted in FIG. 4(a). To reduce interference from adjacent spectral peaks it is preferred to use tagging RF pulses with 90-degree tip angles, which leaves only five (5) spectral peaks, as shown in FIG. 4(b). This protocol involves the acquisition of so-called "raw" Fourier data, as the reconstruction of standard magnitude images from this data would create additional harmonics from the nonlinear processing.

Implementation of 2-D, 1—1 SPAMM tagging involves the successive application of the pulse sequences shown in FIGS. 2(a) and (c). The k-space imaging strategy to acquire these two spectral peaks is preferably accomplished rapidly using multi-shot EPI as shown in FIG. 5. The pulse sequence to implement this scanning strategy is shown in FIG. 2(b). Post-processing bandpass filters are employed to separate these peaks from the raw data (and to remove the central peak if 45-degree tagging RF pulses are used, as in FIG. 4(a).

Further improvement of HARP strain calculations is achieved by removing or reducing interference from the DC spectral peak. The DC spectral peak (or harmonic peak) is the peak at the center of k-space. A solution is to use a higher tagging frequency, which pushes the spectral peaks farther from the frequency origin. This procedure causes an increase in the spectral spreading for the same motion, however, and imaging time is increased because a larger region in k-space must be scanned. It is also known that higher-frequency tags tend to dissipate more rapidly than lower-frequency tags, which further degrades the quality of HARP measurements in later time frames.

A preferred alternate way of the present invention to reduce the influence of the DC spectral peak is to use complementary SPAMM (CSPAMM). As reported by Fischer et al., CSPAMM uses a 1—1 SPAMM pulse sequence followed by a 1-(-1) SPAMM pulse sequence and then subtracts the two. (Fischer et al., True myocardial motion tracking, *Mag. Res. Med.,* 31:401–413, 1994.) As the second pattern is 180-degrees out of phase, the subtraction of the two reinforces the high-frequency, spectral component but eliminates the DC component. To remove the DC associated with the non-tagged tissue as well as the tagged tissue, it is desirable to apply slice selection only to the second tagging pulse. This suppresses the DC spectral peak even when there is through-plane motion.

The use of CSPAMM will double the SNR and eliminate the DC spectral peak at the expense of doubling the imaging time. In the case of 1-D SPAMM applied to cardiac imaging, this procedure yields a pulse sequence that requires four repeating heartbeats, and causes a delay in strain images by four heartbeats. In the case of the 2-D SPAMM tag pattern, the CSPAMM protocol requires a repeating heartbeat and the resulting strain images are delayed by one heartbeat.

Another way to suppress the DC spectral peak would be to reduce the steady-state magnetization. In spoiled GRASS MR imaging, this can be done by choosing an imaging tip angle of 180-$\alpha$ rather than $\alpha$ itself. In this case, it is preferred to multiply the received sequence of FID's (free induction decay) by a sequence of alternating sign. Suppression of the DC signal has not been used for any purpose because it is generally assumed that the primary signals of interest reside near the frequency origin. HARP uses higher frequency spectral data to estimate motion, however, so the DC information is expendable. This is one example of a novel—and completely unexpected—image acquisition change that is possible because of HARP processing methods.

If steady-state magnetization suppression is used, it is preferred to allow the steady-state signal to recover before tagging is initiated. Therefore, one cannot repeatedly excite the same image slice with this approach. Also, the energy deposition associated with continuous 180-$\alpha$ radio frequency (RF) pulses might exceed accepted standards. These are several possibilities to alleviate this situation. One possibility in cardiac imaging is to simply stop imaging at end-systole and allow the steady-state magnetization to recover during diastole. Simulations suggest that this is sufficient time to recover enough magnetization for effective tagging in the next cardiac cycle. Another approach is to alternate 180-$\alpha$ with $\alpha$ pulses, which takes partial advantage of the technique by reducing the DC spectral peak somewhat but retains enough for effective tagging. Another approach is to image throughout the full cardiac cycle, and let the magnetization recover in the next cycle. During the wait, another slice can be imaged yielding a multi-slice 3-D imaging protocol, as described hereinafter.

A further method for suppressing the DC spectral peak will be considered. The diastolic phase is generally more difficult to image using tagging than the systolic phase. This is because tags are most conveniently placed at end-diastole while the heart is relatively stationary and the ECG provides a strong timing signal. If diastolic imaging is desired, a simple way to improve the quality of motion estimation is to use a delayed imaging rather than a cine sequence. Delaying the onset of imaging pulses causes the tagging signal to last longer and HARP images have higher SNR. If delayed imaging is used then a 180-degree inversion pulse can be used between the tagging and (first) imaging pulse to suppress the DC signal and improve HARP image quality.

The area to cover and the required sampling rate in k-space ultimately determines the speed of acquisition. Extremely fast acquisition is generally achieved only with a small field of view (FOV). One possibility is to use the RF coil sensitivity profiles, which automatically limit the FOV, as in SMASH (Sodickson et al, SMASH real-time cardiac MR imaging at echocardiographic frame rates. In Proceedings of the Seventh Meeting of the International Society for Magnetic Resonance in Medicine, Philadelphia, Pa., May 1999, abstract 387.) and SENSE (Weiger et al., High Performance cardiac real-time imaging using SENSE. In Proceedings of the Seventh Meeting of the International Society for Magnetic Resonance in Medicine, Philadelphia, Pa., May 1999, abstract 385.) The use of spectral peaks in HARP processing, however, permits a very powerful alternative.

In a preferred practice of the 2-D embodiment of the present invention, a selective gradient is used during the second RF pulse of the 1—1 SPAMM tagging pulse sequence. This gradient is oriented in the phase-encode direction so that it selects a slab of tissue oriented along the read-out direction thick enough to cover the region-of-interest (e.g., the left ventricle). The tags are therefore restricted in spatial extent as shown in FIG. 6(a), yielding a reduced field-of-view (FOV) tagged region. Fischer et al. used this concept in conjunction with the subtraction process of CSPAMM to cancel the background signal not associated with the object of interest. (Fischer et al., True myocardial motion tracking, Mag. Res. Med., 31:401–413, 1994) This permits the subsampling in the phase encode direction without wrap-around artifacts. With HARP, whose focus is on the acquisition of only spectral peaks, there is an important advantage in that subtraction is not required. Thus, subsampling in the phase-encode direction is possible in HARP with only one tag acquisition. This situation is illustrated in FIG. 6(b).

Imaging three-dimensional (3-D) strain involves a third tag direction possessing a component that is out of the image plane; it also requires some way to take a spatial derivative in the out-of-plane direction. HARP processing, which is based on the information contained in spectral peaks, provides several novel ways to acquire sufficient data for fast, automatic imaging of 3-D strain in the heart and other body tissues.

An out-of-plane tag pattern can be produced by using an out-of-plane gradient during the tagging pulse sequence. This concept is described in U.S. Pat. No. 5,111,820 for the purpose of measuring out-of-plane tissue displacement. The described approach, however, is impractical because it requires the measurement of in-plane tag line displacements of out-of-plane tags. This is problematic because the image of out-of-plane tags are dramatically attenuated due to partial volume within the image plane, as illustrated in FIG. 7. As far as we are aware, however, out-of-plane tagging has never been used in a practical application to date.

One solution to this problem is to image a thinner slice. This would reduce the signal-to-noise ratio, however, and create a problem with through-plane motion. Another solution is to reduce the tag frequency (at least the frequency that is projected onto the image plane). This solution is not ideal for HARP processing, however, as it moves the harmonic spectral peaks closer to the frequency origin, which increases interference with the DC spectral peak.

By focusing on the imaging of spectral peaks for HARP processing, a unique solution is provided by the present invention to the out-of-plane tagging problem. Referring to FIG. 8(a), there is shown three spectral peaks in k-space generated by an out-of-plane, 1-D, 1—1 SPAMM tag pulse sequence. If a standard image were acquired, the high-frequency information associated with the tags and their motion would be attenuated by the process depicted in FIG. 7. In the frequency domain, this causes an attenuation of the harmonic spectral peaks, as indicated dimmer spectral peaks in the 2-D k-space picture shown in FIG. 8(b).

If 2-D Fourier data is acquired after a z-direction phase encoding equal to $k_z = w_l^T h_z$ wherein $h_z$ is unit vector orthogonal to the imaging plane. $w_1$ is a vector representing the tagging: its magnitude is proportional to the tags frequency, and its direction is orthogonal to the tag surfaces. The superscript T indicates the transpose operation. Finally, $k_z$ is z-encoding value, which is computed from this equation. This procedure shifts the k-space acquisition matrix up to the harmonic peak in the 3-D k-space, as shown in FIG. 9(a).

In this case the other harmonic spectral peak and the DC peak are attenuated as shown in the 2-D, k-space domain, as shown in FIG. 9(b). This additional phase encode gradient is a z-gradient positioned within the multi-shot EPI sequence during the initial k-space trajectory from the origin. This pulse sequence is still basically a 2-D imaging sequence, and is just as fast as the fast 2D sequence described herein. The advantage of this approach is that the tags are not attenuated by the obliquity with the imaging plane; instead, they have been effectively "straightened out" by the z phase encoding. This procedure will allow the fast, accurate acquisition of out-of-plane motion information from out-of-plane tagging. Even faster HARP imaging is made possible by using one (1) out-of-plane gradient with the 90-degree RF, 2-D, 1—1 SPAMM tag pattern. In this case five (5) spectral peaks are created in 3-D k-space on a plane tilted relative to the $k_z$=0 plane, as shown in FIG. 10(a). Using the z-direction phase encoding equal to $k_z = w_t^T h_z$ all but two spectral peaks will be attenuated in the corresponding 2-D k-space as shown in FIG. 10(b). Using this technique, one can image two linearly independent harmonic spectral peaks corresponding to out-of-plane tags simultaneously.

This process can be taken a step further by using three 90-degree RF, 1-D, 1—1 SPAMM tagging sequences to create a 3-D tagging pattern, as shown in FIG. 11(a). The tag gradients employed to create this pattern are indicated in the figure using vectors. The corresponding 2-D k-space is shown in FIG. 11(b), where it is observed that three linearly independent tag orientations can be imaged simultaneously. Rather than imaging the dotted region, it may be more convenient to image a square region containing the DC peak, which is already attenuated in this geometry and can be filtered out in post-processing.

This approach facilitates imaging of out-of-plane tags and motion estimation. What is essentially a 2-D imaging approach to acquire information in an image plane sufficient to reconstruct information about 3-D motion. Using 1-D, 2-D, or 3-D tags we are able to acquire this information in 3, 2, or 1 tag acquisitions, respectively. The fastest acquisition (3-D tags) may be at the expense of reduced HARP image quality due to spectral interference and loss of SNR from the intrinsic attenuation caused by the multiple tagging pulse sequence and the loss of SNR in multidimensional tagging.

Given three harmonic peaks, three HARP images can be calculated. If actual harmonic phase could be calculated then because it is a material property of the tissue there would be a unique material point in 3-D associated with its reference position. This would yield the true 3-D deformation. Because HARP images are necessarily "wrapped" to within the range $[-\pi, +\pi)$ by the action of the inverse tangent operator, the true material point is not directly determined. Instead, the methods associated with CINE HARP (CHARP) can be extended and used. In particular, CHARP can be applied separately to pairs of HARP images to yield separately tracked apparent motions. At the reference time the tag planes are known, so the true material position can be determined by intersecting the three tracked planes.

This 3-D CHARP procedure is illustrated in FIG. 12. Assume that three spectral peaks corresponding to three linearly independent tagging vectors $w_1$, $w_2$, and $w_3$, whose orthogonal projections on the imaging plane are given the symbols $\omega_1$, $\omega_2$, and $\omega_3$, respectively. Let the tagging vectors be designed so that $\omega_1$ and $\omega_2$ are linearly independent, and $\omega_1$ and $\omega_3$ are linearly independent, as well. As illustrated in FIG. 12, a point located at y can be tracked, using CHARP with the HARP images corresponding to $\omega_1$ and $\omega_2$, to its apparent reference position $q_A$ on the line $L_A(t_r)$ orthogonal to $w_1$ and $w_2$, simultaneously. Similarly, the point located at y can be tracked, using CHARP with the HARP images corresponding to $\omega_1$ and $\omega_3$, to its apparent reference position $q_B$ on the line $L_B(t_r)$ orthogonal to $w_1$ and $w_3$, simultaneously. Note that $t_r$ is the reference time when the tags were generated. At the reference time, the intersection of the lines $L_A(t_r)$ and $L_B(t_r)$ is the point p, the material reference point associated with y.

3-D CHARP, as described above, can be used to get a better estimate of the circumferential and radial strains (referenced to the spatial coordinates) because the true simple strain can be computed. One cannot get a reference direction pointing out of the plane, however, so a full 3-D strain tensor (or even just the longitudinal strain component) cannot be computed with just this information. Additional imaging information must be acquired for this purpose.

One straightforward way to rapidly acquire enough image information to compute full 3-D strain information using HARP techniques is to image a second slice parallel to and close to the first. Applying 3-D CHARP to each slice yields a dense collection of spatial points with associated 3-D material reference points. Analysis of the deformation of these quadrilaterals, as depicted in FIG. 13, yields an array of full 3-D stain tensors together with the simple strains associated with the radial, circumferential, and longitudinal directions. It should be noted that this approach avoids the use of long-axis images to compute 3-D strain. This is important as there is additional overhead in the imaging and processing of long-axis images.

A preferred embodiment of the above approach would use 3-D, out-of-plane, FOV-selective, tagging pulse sequence with 180-α imaging pulses (for DC magnetization suppression as described above) and simultaneous acquisition of three linearly independent harmonic peaks. In cardiac imaging, one slice would be imaged while the other recovered its DC magnetization, and this process would alternate. With this data, full 3-D strain can, in principle, be calculated on a slice in real-time with a delay of only one heartbeat. At present, these calculations might have to be carried out on a parallel computer in order to achieve this speed, but this does not limit the scope of the invention, only its cost benefits in the present market. Since CHARP is automatic, and computers are getting faster and cheaper, this approach should be computationally feasible on cheaper workstations in the near future.

An important extension of this multi-slice, 3-D CHARP process follows immediately. One could repeat this process to image the entire left ventricle (and possibly the whole heart) within a single breath-hold. Since one image sequence per heartbeat is acquired, it is possible to acquire N slices in an N heartbeat breath-hold. Typical values for N in conventional breath-hold imaging are N=8 to N=16. This procedure yields an impressive spatial density of strain estimates over the myocardial volume in an unprecedented short time.

One limitation of the 3-D CHARP approach is that it requires an image sequence so that the HARP phases can be tracked. Because of this, it is unlikely that the diastolic phase of the heart cycle can be imaged without using mid-cycle tagging. In this case, volumetric 3-D CHARP (in a breath-hold, for example), would be required in order to piece together the systolic and diastolic phases for coordinated analysis of strain with a single material reference. There may be applications, however, in which examination of a dense Eulerian strain map at various times in the cardiac cycle without reference to a material point is sufficient.

The 3-D CHARP approach uses tracking to compute a material reference and strain. An alternate approach is to use single-shot HARP (SHARP), which uses spatial gradients of harmonic phase to compute the Eulerian strain at each pixel. One straightforward implementation of SHARP in 3-D is to acquire two adjacent slices with three tag orientations on each. Spatial derivatives are readily approximated in analogy to 2-D SHARP, yielding 3-D Eulerian strain. Slice thickness will lead to poor out-of-plane spatial derivatives with this method, however. The resulting computed strain will have high error in the out-of-plane direction. This invention also provides a novel approach to image a 3-D strain tensor within a single slice.

The basic concept can be understood by considering what happens to the out-of-plane tag profile when there is out-of-plane strain. Suppose an out-of-plane tagging pulse sequence is used to generate a 3-D, k-space distribution of spectral peaks such as that shown in FIG. 8. Because the center frequency of the harmonic spectral peak is not zero in the z direction, the tag profile through the image slice will be oscillatory, as shown in FIG. 14(a). If the underlying tissue undergoes compression in the z-direction, then the tag frequency will increase as shown in FIG. 14(b). Note that the slice thickness does not compress because slice selection is done after tissue motion. If the tissue undergoes stretching in the z-direction, then the tag frequency will decrease as shown in FIG. 14(c). The invention finds the local tag frequency in the out-of-plane direction and uses this to estimate the strain in the out-of-plane direction. Combining this with in-plane SHARP methods yields a full 3-D strain tensor in the Eulerian sense.

Local out-of-plane tag frequency can be estimated accurately by imaging the same slice twice with two different z direction phase-encodings. Let $w_1$ be the k-space vector pointing to the center of a harmonic peak, as shown in FIG. 8(a), and let $\upsilon_0 = w_l^T h_z$ be the height of this peak in the z-direction. The slice is then imaged twice using phase encodings equal to $v_a = v_0 - \pi/\Delta$ and $v_b = v_0 + \pi/\Delta$, wherein $\Delta$ is the slice thickness and $v_0$, $v_a$, and $v_b$, are the values of the encodings in the z direction using appropriate z gradient waveforms and are computed from the equations given in this paragraph, yielding the images $I_l(y,t;v_a)$ and $I_l(y,t;v_b)$. The term $I_l(y,t;v_a)$ represents the image acquired at time t with z-encoding $v_a$. In fact, it represents the intensity (which can be a complex number) of the image at point y on the image plane. The term $I_l(y,t;v_b)$ is the same as $I_l(y,t;v_a)$ but with z-encoding $v_b$. The following formula can be used to estimate the local frequency in the out-of-plane direction $$v_l = \frac{1}{a} Re\left\{ \frac{v_a I_l(y, t; v_a) + v_b I_l(y, t; v_b)}{I_l(y, t; v_a) + I_1(y, t; v_b)} \right\} - \frac{bv_0}{a}$$

where Re means take the "real part" which is the real part of a complex number. The constants a and b are determined by the slice profile. If the slice profile is rectangular with width $\Delta$ then a=1 and b=0. If the slice profile is Gaussian with standard deviation $\Delta/4$ then a=0.55 and b=0.45.

Choosing the tagging vector in the orthogonal direction $h_z$ would relate the frequency $v_l$ to the longitudinal strain. This measurement is sufficient when only measuring the longitudinal strain. This is a new approach computing the longitudinal strain. A generally similar method is that described by Robson et al., Constable, Three-dimensional strain-rate imaging, *Magn. Res. Med.*, 36(4):537–546, 1996.) In their method, the phase contrast is used rather than tagging, and the measured quantity is the strain rate—which is more sensitive to noise. The above calculation gives the out-of-plane local frequency at each time t and point y in the image plane. The in-plane local frequencies are calculated using finite differences as follows. A conventional HARP image can be formed by adding the two acquired images yielding $I_l(y,t) = I_l(y,t;v_a) + I_l(y,t;v_b)$, which to good approximation is not dependent on $v_a$ and $v_b$. The calculated phase of $I_l(y,t)$ is a standard HARP image $a_l(y,t)$. As has been shown in SHARP, the 2-D gradient $\nabla^* a_l(y,t)$ calculated using local differences yields the components of the local frequency in the basis directions $h_1$ and $h_2$ within the plane. The term $I_l(y,t)$ is a synthesized image from $I_l(y,t;v_a)$ and $I_l(y,t;v_b)$ by simple summation. The term $a_l(y,t)$ is called HARP image, which is computed from the angle of the complex image $I_l(y,t)$. The term $\nabla^* a_l(y,t)$ is the gradient of $a_l(y,t)$ with respect to y removing the wrapping effect. The subscripts l=1, 2, 3, indicate the terms corresponding to the vectors $w_1$, $w_2$, and $w_3$, respectively. The above procedures show how to calculate the local frequency in three orthogonal directions $h_z$, $h_1$, and $h_2$ given the pair of observed images $I_l(y,t;v_a)$ and $I_l(y,t;v_b)$ corresponding to out-of-plane tag frequency $w_l$ and two phase encodes $v_a$ and $v_b$. Assume these images are available for three linearly independent tag frequencies $w_1$, $w_2$, and $w_3$. Then the deformation gradient of the reference map can be calculated as follows $$\nabla p(x,t) = [w_1 \ w_2 \ w_3]^{-T} \begin{bmatrix} \nabla^* a_1 & v_1 \\ \nabla^* a_2 & v_2 \\ \nabla^* a_3 & v_3 \end{bmatrix} [h_1 \ h_2 \ h_z]^{-1}.$$

The terms $h_1$ and $h_2$ are unit vectors that lie on the imaging plane, and are orthogonal to each other. The term $h_z$ is a unit vector orthogonal to the imaging plane. The superscript $-1$ indicates the inverse of a matrix, and the superscript $-T$ indicates the inverse transpose of a matrix. The term $\nabla p(x,t)$ is the gradient of the material reference map $p(x,t)$ with respect to x.

This quantity is sufficient to calculate all three-dimensional Eulerian strain quantities on the image plane.

Selective tagging and tag modulation will be considered. In HARP, tagging is seen as a modulation process. In particular, each sinusoidal component of the tag pattern produces a spectral peak in k-space (Fourier space). In HARP motion processing, the phase of the complex image corresponding to a spectral peak is directly used to compute motion information. Previously, the magnitude of the complex image has only been used to provide a rough segmentation of the myocardium. Fast acquisition of spectral peaks, however, offer the possibility of very fast imaging of moving anatomy and dynamic processes and fast multislice imaging.

Reduced field-of-view (FOV) imaging was discussed above from the context of fast acquisition of spectral peaks for HARP processing. The basic idea is to tag only a slab of tissue in the phase-encode direction, which modulates only a portion of the tissue. When the spectral peak is imaged using multi-shot EPI or spiral imaging, only the tagged tissue is imaged. This corresponds to a reduced FOV in the phase-encode direction, and sparse phase encode sampling can be used without overlapping tissue artifacts. This process can be used for fast imaging of anatomy and dynamic processes as well. The only difference is that the magnitudes of the harmonic images are visualized instead of their phase being used for motion computations.

Another way to use tag modulation is in simultaneous acquisition of multiple slices. In this approach two adjacent slices are tagged in rapid succession with differently oriented tags (whose harmonics do not overlap). We then image the combined thick image slice, acquiring at least two harmonics. Reconstructing the magnitude images from these harmonics yields images from different spatial positions. This principle can be extended to even more images provided that the spectra do not overlap.

It will be appreciated, therefore, that the present invention has provided means for rapidly determining strain in a portion of a living patient. This may be accomplished in real-time or approximate real-time with two-dimensional or three-dimensional imaging. The preferred system employs harmonic phase (HARP) magnetic resonance imaging.

Compared with previously known SPAMM tag pattern, the present invention requires imaging of only one of the several harmonic peaks per tag excitation. Also, the HARP processing using this data to calculate directly motion quantities rapidly and automatically without human intervention. This facilitates real-time strain imaging in a manner not previously achievable. Further, the present invention provides a practical way to employ out-of-plane tags employing two-phase encodings to estimate out-of-plane strain components. Under prior art systems, out-of-plane tags were largely useless due to the very rapid attenuation of tag pattern.

CSPAMM may be used in the present invention to reduce or eliminate the adverse effects of the DC harmonic peak. CSPAMM may involve imaging only the tag pattern itself, CSPAMM coupled to fast imaging of spectral peaks, HARP processing and out-of-plane motion imaging is part of the present invention. The present invention extends CSPAMM by focusing on isolated spectral peaks and out-of-plane phase encoding for 3-D strain imaging. The present invention further provides multi-slice acquisition within this framework leading to the capability of full volumetric acquisition sufficient for automated 3-D motion calculations within a breath-hold. The ability of HARP to tag and image large motions such as in single-shot HARP, for example, provides advantages over phase contrast (PC) which can image only small motions and tends to have a low signal-to-noise ratio and, therefore, is not amenable to fast imaging. With respect to the recently suggested DENSE method, the present HARP method requires only significant information around the spectral peak while DENSE acquires a significant amount of k-space. Also, HARP uses lower frequency tags in general so that tag fading is minimized. The present invention also provides dual out-of-plane phase encoding for calculation of out-of-plane strain and the fast acquisition of multiple harmonics for full 3-D motion computations with one acquisition.

While it has been known to provide rapid magnetic resonance imaging employing echo-planar techniques, the present invention's use of multi-shot EPI acquisition of tagged images focusing on spectral peaks and HARP analysis is a substantial expansion thereover. Also, the present invention's rapid acquisition of peaks for real-time strain and 3-D within a breath-hold represents significant extensions to existing technology.

While limiting field of view in order to speed up magnetic resonance image acquisition, has been suggested in SMASH and SENSE, neither technology has been applied directly to tagged images. Also, the present invention provides a new way of reducing field of view for HARP applications.

Whereas particular embodiments have been described herein for purposes of illustration, it will be evident to those skilled in the art that numerous variations of the details may be made without departing from the invention as claimed in the appended claims.

What is claimed is:

1. A method of measuring three-dimensional motion of an object by harmonic phase magnetic resonance imaging comprising:

applying a first tag pulse sequence to spatially modulate a region of said object within a short axis plane;

acquiring a first spectral peak from the Fourier domain of said spatially modulated object;

computing the inverse Fourier transform information of said acquired first spectral peak;

computing a first harmonic phase image;

applying a second tag pulse sequence to spatially modulate a region of interest of said object in a direction perpendicular to said first tag pulse sequence within a short axis plane;

acquiring a second spectral peak from the Fourier domain of said spatially modulated object;

computing the inverse Fourier transform information of said acquired second spectral peak;

computing a second harmonic phase image;

creating tagged images of circumferential and radial strains by combining said first harmonic phase image and said second harmonic phase image;

applying a third tag pulse sequence in a third direction generally perpendicular to said first and second tag pulse sequences through said region of interest of said object, and creating a third harmonic phase image therefrom;

applying a fourth tag pulse sequence of a different strength than said third tag pulse sequence in a fourth direction generally perpendicular to said first and second tag sequences and generally in said third direction and creating a fourth harmonic phase image therefrom; and determining longitudinal strain by combining said third and fourth harmonic phase images to determine strain in a longitudinal direction.

2. The method of claim 1 including employing frequency alteration in effecting said step of determining longitudinal strain.

3. The method of claim 2 including in effecting said step of determining longitudinal strain determining a reduction in frequency as resulting from stretching and an increase in frequency as resulting from contraction.

4. The method of claim 1 including combining said third and fourth images by applying a mathematical relationship thereto.

5. The method of claim 1 including employing said method to obtain a real-time image of cardiac motion.

6. The method of claim 5 including employing said method to obtain a real-time image of myocardial strain.

7. The method of claim 1 including employing said method to determine Eulerian strain within a myocardium.

8. The method of claim 1 including employing said method to image Langrangian strain within a myocardium.

9. The method of claim 1 including effecting said measurement while reducing the effects of DC harmonic peaks.

10. The method of claim 9 including
effecting said reduction in the effects of DC harmonic peaks by reducing steady state magnetization.

11. The method of claim 1 including
effecting said third and fourth pulse sequences on adjacent separate slices of said object.

12. The method of claim 1 including
acquiring each of said spectral peaks by filtering.

13. The method of claim 1 including
employing 1—1 SPAMM (spatial modulation of magnetization) tag sequences in each said tagging sequence.

14. The method of claim 1 including
employing a 2-D 1—1 SPAMM (spatial modulation of magnetization) tag pattern in applying said first tag pulse sequence and said second tag pulse sequence.

15. The method of claim 1 including
employing 3-D 1—1 SPAMM (spatial modulation of magnetization) tag sequences in each of said tag pulse sequences.

16. The method of claim 1 including
effecting said three-dimensional motion determination in an automated manner within a breath-hold.

17. The method of claim 1 including
employing a reduced field-of-view in said tagged images acquisition.

18. The method of claim 1 including
employing multi-shot EPI (echo planar imaging) imaging in acquiring said spectral peaks.

19. The method of claim 1 including
effecting said motion determination in real-time with real-time strain imaging with no breath-holds.

20. The method of claim 1 including
effecting said motion determination with near real-time imaging of three-dimensional strain within an image plane.

21. The method of claim 1 including
effecting said determination with real-time imaging of a dynamic process within a patient.

22. The method of claim 1 including
employing simultaneous acquisition of linearly independent spectral peaks in effecting said spectral peak isolation.

23. The method of claim 1 including
effecting said calculation of motion by calculating strain with alternating tag orientations.

24. The method of claim 1 including
initiating the imaging sequences of at least some of said tagging sequences at the end of the diastole.

25. The method of claim 1 including
employing spiral imaging in effecting said imaging.

26. A method of measuring motion of an object in real-time by harmonic phase magnetic resonance imaging comprising:
applying a first tagging pulse sequence to create horizontal tags in a region of interest of said object;
acquiring a first spectral peak from the Fourier domain of said spatially modulated object;
computing the inverse Fourier transform information of said acquired first spectral peak;
computing a first harmonic phase image from said first spectral peak;
applying a second tagging pulse sequence to create vertical tags to spatially modulate a region of interest of said object;
acquiring at least one second spectral peak from the Fourier domain of said spatially modulated object;
computing the inverse Fourier transform information of said acquired second spectral peak;
computing a second harmonic phase image from said second spectral peak;
employing 1—1 SPAMM (spatial modulation of magnetization) as a tagging protocol employed in creating said first and second harmonic phase images; and
determining strain from said first and second harmonic phase images.

27. The method of claim 26 including
employing said method to image an in vivo heart.

28. The method of claim 27 including
effecting said calculation of motion by calculating strain with alternating tag orientations.

29. The method of claim 27 including
initiating at least some of said tagging sequences at the end of the diastole.

30. The method of claim 27 including
employing spiral imaging in effecting said imaging.

31. The method of claim 26 including
employing 1-D 1—1 SPAMM (spatial modulation of magnetization) tagging in said method.

32. The method of claim 26 including
employing as said first tagging pulse sequence a horizontal sequence, and
employing as said second tag sequence a vertical sequence.

33. The method of claim 32 including
applying said horizontal tags and imaging based thereon in alternating sequence with said vertical tags and imaging thereof.

34. The method of claim 26 including
employing 2-D 1—1 SPAMM (spatial modulation of magnetization) tagging in said method.

35. The method of claim 34 including
acquiring two linearly independent spectral peaks substantially simultaneously.

36. The method of claim 35 including
employing multi-shock echo-planar magnetic resonance imaging in acquiring said spectral peaks.

37. The method of claim 26 including
employing tagging RF pulses with a 90-degree tip angle in said process.

38. The method of claim 26 including
employing overlapping tag acquisitions in said process.

39. The method of claim 26 including
effecting said strain determinations while resisting interference from DC spectral peaks.

40. The method of claim 39 including
effecting said reduction in DC spectral peak by employing a complementary SPAMM (spatial modulation of magnetization) tag sequence.

41. The method of claim 40 including
effecting said reduction in DC spectral peak influence by reducing steady state magnetization.

42. The method of claim 26 including
acquiring each said spectral peak by filtering.

43. The method of claim 26 including
employing 1—1 SPAMM (spatial modulation of magnetization) tag sequences in each said tagging sequence.

44. The method of claim 26 including employing a 2-D 1—1 SPAMM (spatial modulation of magnetization) tag pattern in applying said first tag pulse sequence and said second tag pulse sequence.

45. The method of claim 26 including employing 3-D 1—1 SPAMM (spatial modulation of magnetization) tag sequences in each of said tag pulse sequences.

46. The method of claim 26 including effecting said three-dimensional motion determination in an automated manner within a breath-hold.

47. The method of claim 26 including employing a reduced field-of-view in said tagged image acquisition.

48. The method of claim 26 including employing multi-shot EPI (echo planar imaging) imaging in acquiring said spectral peaks.

49. The method of claim 26 including effecting said reduction in the effects of DC harmonic peaks by reducing the steady state magnetization.

50. The method of claim 26 including effecting said motion determination with real-time strain imaging with no breath-holds.

51. The method of claim 26 including effecting said motion determination with near real-time imaging of three-dimensional strain within an image plane.

52. The method of claim 26 including effecting said determination with real-time imaging of a dynamic process within a patient.

53. The method of claim 26 including employing simultaneous acquisition of linearly independent spectral peaks in effecting said spectral peak isolation.

54. A method for tracking the 3D (three dimensional) motion of an object by harmonic phase magnetic resonance imaging comprising:

applying three tag sequences to spatially modulate a region of said object in three linearly independent directions;

the first and second tagging directions of said tag sequences having linearly independent orthogonal projections on an imaging plane;

the first and third tagging directions of said tag sequences having linearly independent orthogonal projections on said imaging plane;

acquiring three spectral peaks from the Fourier domain of said spatially modulated object;

computing the inverse Fourier transform information of each of said acquired spectral peaks;

computing a harmonic phase image for each said inverse Fourier transform;

tracking a point using a CHARP (cine harmonic phase) method on the first and second said harmonic phase images;

tracking a point using a CHARP (cine harmonic phase) method on the first and third said harmonic phase images; and computing the actual 3D (three dimensional) reference position of said tracked point by combining the results of the two said tracks.

55. The method of claim 54 including effecting said measurement while reducing the effects of DC harmonic peaks.

56. The method of claim 55 including effecting said reduction in the effects of DC harmonic peaks by reducing steady state magnetization.

57. The method of claim 54 including employing multi-shot EPI (echo planar imaging) imaging and acquiring said spectral peaks.

58. The method of claim 54 including employing a reduced field-of-view in said tagged images acquisition.

59. The method of claim 54 including effecting motion determination in real-time with real-time strain imaging with no breath-holds.

60. The method of claim 54 including effecting said determination with real-time imaging of a dynamic process within a patient.

61. The method of claim 54 including employing simultaneous acquisition of linearly independent spectral peaks in effecting said spectral peak isolation.

62. The method of claim 54 including employing spiral imaging in effecting said imaging.

* * * * *